United States Patent [19]
Baker

[11] 4,056,811
[45] Nov. 1, 1977

[54] CIRCUIT FOR THE IMPROVEMENT OF SEMICONDUCTOR MEMORIES

[76] Inventor: Roger T. Baker, P.O. Box 240, Mount Tabor, N.J. 07878

[21] Appl. No.: 657,769

[22] Filed: Feb. 13, 1976

[51] Int. Cl.² .............................................. G11C 11/40
[52] U.S. Cl. .................................... 365/189; 365/183; 365/73
[58] Field of Search ....... 340/173 R, 173 FF, 173 RC

[56] References Cited
U.S. PATENT DOCUMENTS 3,914,750  10/1975  Hadden ............................ 340/173 R Primary Examiner—Terrell W. Fears

[57] ABSTRACT

The memory cells in the rows of a random access memory are divided in to subrows, and an access transistor is used selectively isolate or connect the output terminals of each subrow of memory cells to the row line. When recalling the datum from a memory cell, the subrow is isolated, and thus the loading of the output signal from that memory cell is reduced. Consequently, an improved output signal can be obtained from a memory cell with a given size storage capacitance, or a smaller storage capacitance can be used in the memory cell, or both.

6 Claims, 8 Drawing Figures

CIRCUIT FOR THE IMPROVEMENT OF SEMICONDUCTOR MEMORIES

BACKGROUND OF THE INVENTION

This invention relates to semiconductor memories, particularly those memories which utilize capacitive means for the storage of binary data.

In the description of the present invention, the term "transistor" refers to either a bipolar transistor or to a field effect transistor. When referring to the terminals of a transistor, the term "control terminal" designates the gate of a field effect transistor, and the base of a bipolar transistor; the term "input terminal" designates the source of a field effect transistor and the emitter of a bipolar transistor, and the term "output terminal" designates the drain of a field effect transistor and the collector of a bipolar transistor. Also the "state of the transistor" refers to the alternative on or off states of the transistor — when the transistor is on, the resistance between the input and output terminals is relatively small, and conversely, when the transistor is off, the resistance between the said terminals is relatively large. The state of the transistor is controlled by the potential of the control terminal relative to the input terminal when the transistor is operated in the forward mode, and by the potential of the control terminal relative to the output terminal when the transistor is operated in the reverse mode.

The economics relevant to semiconductor random access memories make it desirable to minimize the semiconduct surface area required per bit. The semiconductor surface area required per bit includes the area of the memory cell itself, and a proportionate share of the area required for the support circuitry, access pads, and other elements required for the operation or manufacture of the memory. In the prior art, the most dense memories use dynamic types of memory cells in which a storage capacitor which may be charged to either of two different states is utilized to store binary data, and a transistor is used to provide addressable access to the storage capacitor. Since the capacitance of the storage capacitor depends directly on the surface area of the storage capacitor, the minimum size of this type of memory cell depends in part, on the size of the storage capacitor.

In the aforementioned memory cells, for a particular memory array size, the loading of the storage capacitor usually determines the minimum capacitance required. In particular, when recalling the datum stored in a memory cell, part of the charge on the storage capacitor is discharged on to a row line which interconnects a plurality of memory cells to the input of a sense amplifier. Therefore the storage capacitance must be sufficiently large so that when it is charged and then discharged on to the row line, it is capable of charging up the capacitance consisting of the parallel combination of the capacitance of the row line itself, the input capacitance of the other memory cells connected to the same row line, and the input capacitance of the sense amplifier. The voltage to which the said parallel combination of capacitors must be charged depends on the minimum voltage level sufficient to be reliably detected by the sense amplifier.

In the prior art, at least three techniques have been devised to permit reduction of the storage capacitance. The first technique is based on the observation that the number of memory cells connected to each of the row lines determines, in part, the capacitive loading of the storage capacitor. For an array with a fixed number of memory cells, simply by decreasing the number of memory cells connected to each row line, and increasing the number of row lines in the array, the capacitive loading of the storage capacitor could be decreased to a relatively small value. But considerations such as minimizing the complexity of and minimizing the semiconductor surface area required for the support circuitry, limit the number of row lines that may be used in the array, and therefore determines the number of memory cells that must be connected to each row line. However, it is possible to split the memory cells appearing in one row in to two contiguous groups, and locate the sense amplifier for each row in the break between the two groups of memory cells. By using an appropriate sense amplifier, this can be accomplished without significantly complicating the support circuitry. However the prior art does not permit this technique to be used to further subdivide the memory cells appearing in one row without greatly complicating the support circuitry.

The second technique has been to improve the sensitivity of the sense amplifiers through improved design, improved manufacture, and improved operating techniques.

A third technique which has not been adopted by most memory manufacturers is described in U.S. Pat. No. 3,764,906, dated Oct. 9, 1973 and granted to Lawrence G. Heller. In the technique described in this patent, the electrical charge lost from the storage capacitor as it charges up the loading capacitor is replaced from a fixed quantity of charge. The change in this fixed quantity of charge is then used to drive the sence amplifier.

SUMMARY OF THE INVENTION the circuit of this invention reduces the loading of the storage capacitor by dividing the memory cells in each row in to subrows, and isolating each subrow of memory cells from other subrows of memory cells by means of an access transistor. During operations other than recall, the access transistor is maintained in the on state, providing a low resistance path between the memory cells in the subrows and the row lines. During the recall operation, the access transistors are maintained in the off state. Thus the memory cells in each subrow are isolated from the other subrows of memory cells, so that the capacitive loading of the storage capacitor is determined in part, by the number of memory cells in each subrow rather than by the total number of memory cells per row.

Some of the circuitry required to implement this invention must be included within the array of memory cells, and some of the circuitry required to implement this invention can be external to the array of memory cells. The circuitry that is included within the array of memory cells consists of, at most, two transistors per subrow. This feature is important, since effective utilization of the surface area of the semiconductor requires that the dimensions of the circuitry included within the array of memory cells conform to the pitch of the memory cells in at least one direction. That is, when implemented on a semiconductor substrate, the surface area required for said circuitry must not have both a larger X dimension than, and a larger Y dimension than a single memory cell.

The use of this invention is not limited to the above type of memory cells, but can be used with other types of memory cells such as those shown and described in the copending applications for patents entitled "Semiconductor Device for the Storage of Binary Data" filed on Sept. 9, 1975, Ser. No. 613,189 U. S. Pat. No. 3,997,799 issuing 12-14-76 and the copending patent application entitled "A Method for Operating Charge Transfer Memory Cells" filed on Dec. 22, 1975, Ser. No. 642,721, both by the same inventor as of the present invention.

Accordingly, it is a general object of this invention to provide an electrical circuit which can be used to improve the performance of memory cells by reducing the capacitive loading of the output signal from the memory cells when the datum stored therein is recalled. Furthermore, with this invention, the aforementioned improvements are achieved with circuitry that requires a minimum of semiconductor surface area.

It is another object of this invention to reduce the output loading of the memory cells so that a minimized storage capacitor can be used in the memory cells, thus permitting the area of said memory cells to be minimized.

It is another object of this invention to improve the output signal from the memory cells so as to obtain faster operating speeds for the memory.

It is still another object of this invention to improve the output signal from the memory cells to permit an increase in the number of memory cells per row.

These and other objects and features of the present invention will be apparent from the following description and illustration of the preferred embodiments of this invention.

DESCRIPTION OF THE PREFERRED EMBODIMENTS

Figure 1:
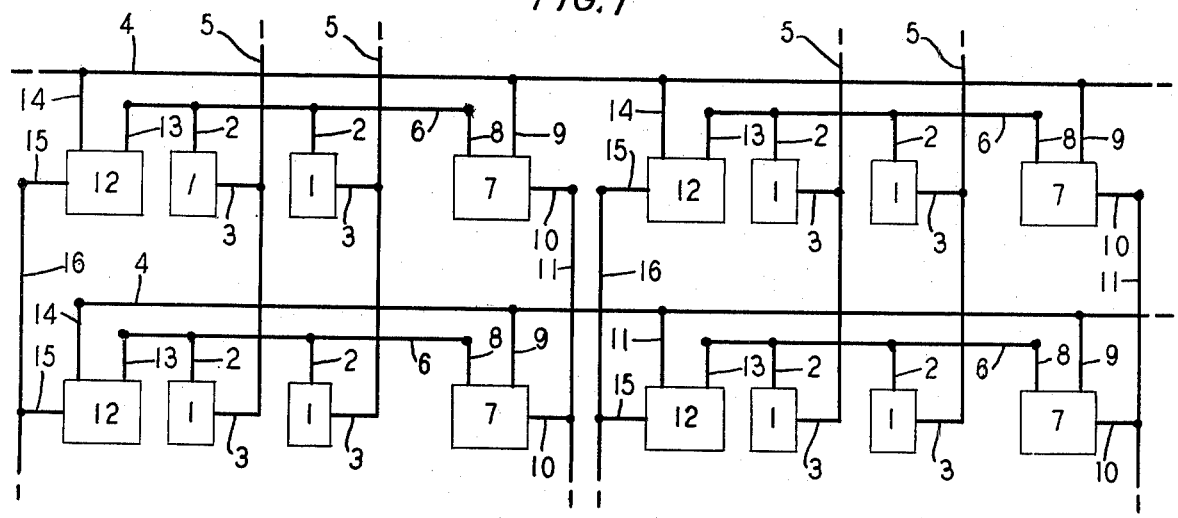
FIG. 1 shows a schematic diagram of a portion of an array of memory cells in which the circuit of the present invention is included.

Referring to FIG. 1, 1 indicates the memory cells, all of which have essentially the same physical and electrical characteristics. Each memory cell 1 has an output terminal 2 and a control terminal 3. The memory cells 1 are disposed in a two dimensional array of rows and columns, with a distinct row conductor 4 being associated with each row of memory cells 1, and a distinct column conductor 5 being associated with each column of memory cells 1. Furthermore, each row of memory cells 1 is subdivided in to contiguous subrows, and a distinct subrow conductor 6 is associated with each subrow of memory cells 1. All the memory cells 1 appearing in one subrow have their output terminals 2 connected in common by means of a subrow conductor 6. An access transistor 7 is connected between each particular subrow conductor 6 and that row conductor 4 corresponding to the row to which the memory cells 1 connected to that particular subrow conductor 6 belong. The output terminal 8 of each access transistor 7 is connected to one subrow conductor 6, and the input terminal 9 of each access transistor 7 is connected to one row conductor 4. The control terminal 10 of each access transistor 7 is connected to a control conductor 11. The access transistors 7 are disposed in rows and columns, and each control conductor 11 connects in common the control terminals 10 of all those access transistors 7 which appear in the same column. Similarly a gain transistor 12 is connected between each subrow conductor 6 and that row conductor 4 corresponding to the row in which the memory cells 1 connected to that subrow conductor 6 belong. The control terminal 13 of each gain transistor 12 is connected to one subrow conductor 6. The input terminal 14 of each gain transistor 12 is connected to one row conductor 4. The output terminal 15 of each gain transistor 12 is connected to a conductive voltage bus 16. The gain transistors 12 are disposed in rows and columns, and each voltage bus 16 connects in common the output terminals 15 of all those gain transistors 12 which appear in the same column.

In FIG. 1, a representative memory cell 1 is shown, and only those terminals of the memory cells 1 which are connected to the circuitry or the present invention are shown. Other types of memory cells can have additional terminals, and can require additional circuitry when used with the present invention, but FIG. 1 exemplifies this invention, and together with the other figures and the description of this invention, is adequate to teach those skilled in the semiconductor art how to use this invention with any particular type of memory cell. It is also to be understood that in a practical embodiment of this invention, there can be a large number of memory cells 1 in the memory array, and that the number of memory cells 1 per subrow would be determined by detailed analysis of the particular type of memory cell used.

Figure 2:
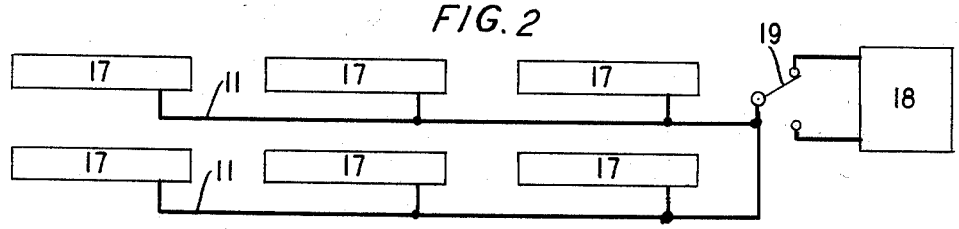
FIG. 2 shows a schematic diagram illustrating one way the access transistors of this invention can be controlled.
Figure 3:
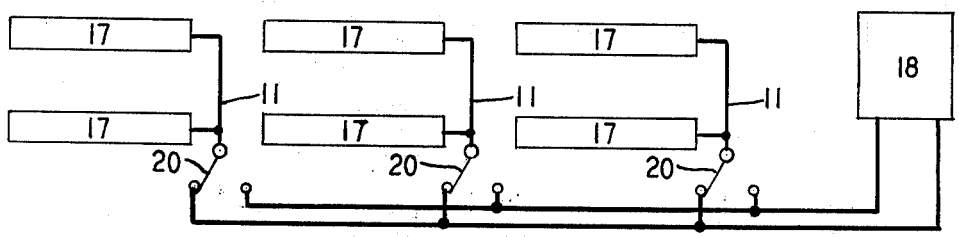
FIG. 3 shows a schematic diagram illustrating an alternative way to control the access transistors of this invention.
Figure 4:
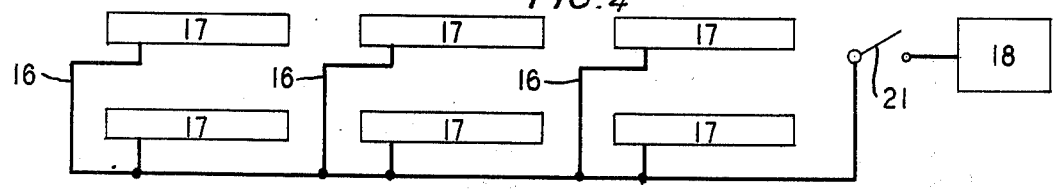
FIG. 4 shows a schematic diagram illustrating one way the gain transistors of this invention can be controlled.
Figure 5:
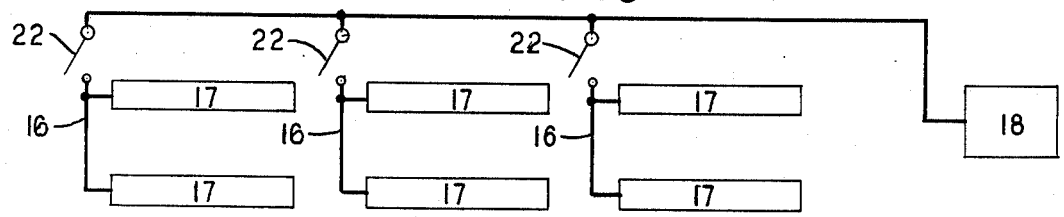
FIG. 5 shows a schematic diagram illustrating an alternative way of controlling the gain transistors.

FIGS. 2, 3, 4, and 5 show alternative methods for connecting the control conductors 11 and the voltage buses 16 to voltage sources 18. In FIGS. 2, 3, 4, and 5, 17 indicates the combination of one subrow of memory cells 1, a gain transistor 12, and an isolation transistor 7. FIG. 2 shows how all the control conductors 11 can be connected in common and a switch 19 provided for connecting the control conductors 11 to either of two terminals from the voltage source 18. In FIG. 3 separate switches 20 are provided for each column of elements 17, so that the potential applied to each control conductor 11 can be independently selected. FIG. 4 illustrates how all the voltage buses 15 can be connected in common and a switch 21 used to provide means for alternately connecting the voltage buses 15 to a voltage source 18, or isolating the voltage buses 5. In FIG. 5 separate switches 22 are provided for each column of elements 17 providing means by which each voltage bus 15 can be either connected to the voltage source 18 or left isolated .

Figure 6:
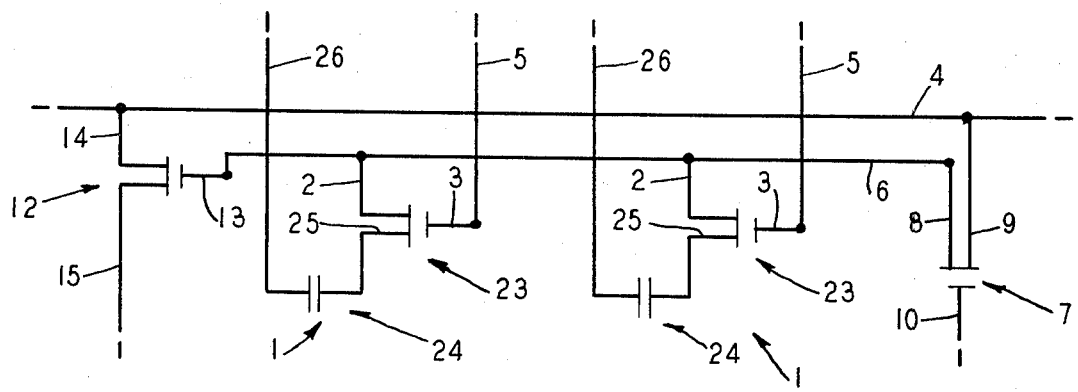
FIG. 6 shows schematically a subrow of a particular type of memory cell in which the circuit of the present invention is included.

FIG. 6 illustrates in detail how the present invention can be used with a specific type of memory cell 1, called hereinafter the 1-T cell. In FIG. 6, a subrow of memory cells 1, which for illustrative purposes consists of two memory cells 1, is shown. The row conductor 4, the column conductors 5, the subrow conductor 6, and the access transistors 7, with its output terminal 8 connected to the subrow conductor 6, its intput terminal 9 connected to the row conductor 4, and its control terminal 10 are also shown. In this case, the access transistor 7 is a field effect transistor. Also shown in FIG. 6 is the gain transistor 12, with its control terminal 13 connected to the subrow conductor 6, its input terminal 14 connected to the row conductor 4, and its output terminal 15. In this case, the gain transistor 12 is a field effect transistor. Each memory cell 1 consists of a control transistor 23, which is a field effect transistor, and a storage capacitor 24. The control terminal 3 of the memory cell 1 is also the control terminal of the control transistor 23 and is connected to the column conductor 5. The output terminal 2 of the memory cell 1 is also the output terminal of the control transistor 23, and is connected to the subrow conductor 6. The input terminal 25 of the control transistor 23 is connected to one plate of the storage capacitor 24, and the other plate of the storage capacitor 24 is connected to a bias bus 26.

Figure 7:
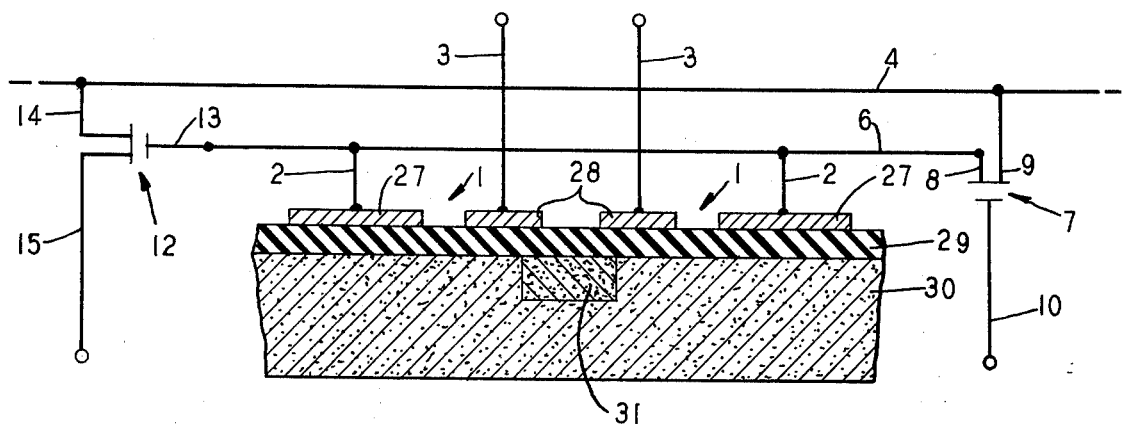
FIG. 7 shows schematically a subrow of an alternative type of memory cell in which the circuit of the present invention is included.

FIG. 7 shows in detail how the present invention can be used with an alternative type of memory cell 1, called hereinafter the CCD cell. In FIG. 7, one subrow of memory cells 1 is shown, including the row conductor 4, the subrow conductor 6, the access transistor 7, with its ouput terminal 8, its input terminal 9, and its control terminal 10. The gain transistor 12 is shown, with its control terminal 13, its input terminal 14, and its output terminal 15. Both the access transistor 7 and the gain transistor 12 are field effect transistors. The memory cells 1 are shown in cross section because no accepted schematic symbol has been adopted for such elements. Each memory cell 1 consists of a first electrode 27, which is connected to the output terminal 2, and a gate 28, which is connected to the control terminal 3. A thin layer of insulating material 29 separates the first electrodes 27 and the gates 28 from the semiconductor substrate 30. A source 31, which is of the conductivity type opposite that of the substrate 30 is formed in the semiconductor substrate 30.

Figure 8:
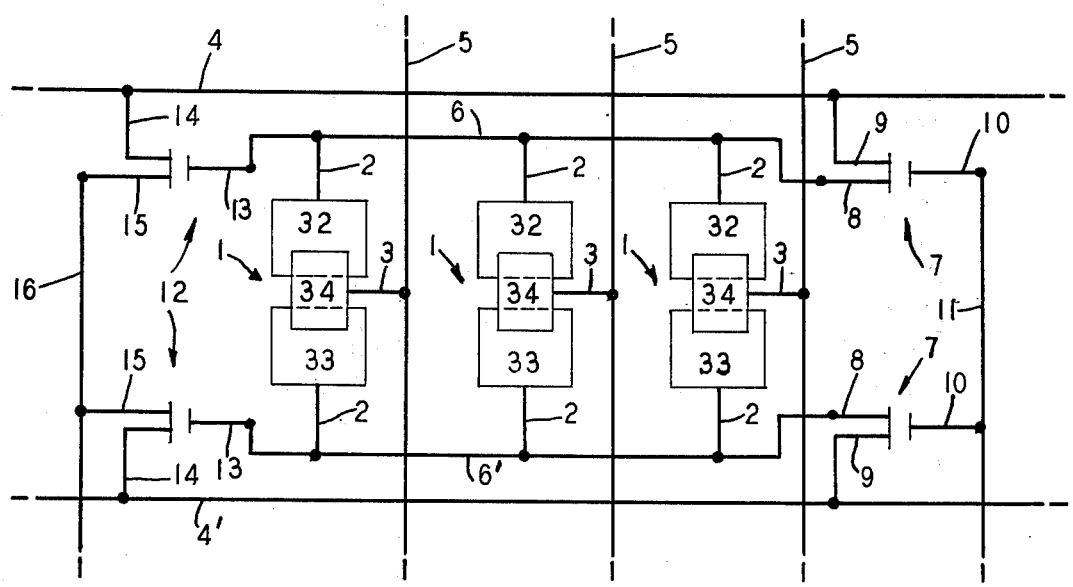
FIG. 8 shows schematically a subrow of a second alternative type of memory cell in which the circuit of the present invention is included.

FIG. 8 shows in detail how the present invention can be used with the memory cell described in the aforementioned pending patent, Ser. No. 642,721. In FIG. 8 one subrow of memory cells 1 is shown, including the A row conductors 4, the B row conductors 4', the A subrow conductors 6 and the B subrow conductors 6', the access transistors 7, with their output terminals 8, their input terminals 9, and their control terminals 10, the later being connected to a control conductor 11. Also shown in FIG. 8 are the gain transistors 12, with their control terminals 13, their input terminals 14, and their output terminals 15, the later being connected to a voltage bus 16. Three memory cells 1 are shown, each of which has an A electrode 32, a B electrode 33, and a gate electrode 34. Each gate electrode 34 is connected to a control terminal 3, which in turn is connected to a column conductor 5. Each A electrode 32 is connected to an ouput terminal 2, which in turn is connected to the A subrow line 6. Likewise each B electrode 33 is connected to an output terminal 2, which in turn is connected to the B subrow conductor 6'.

The components required to implement this invention, such as the transistors and the conductive means, can be formed using the techniques that have been developed in the semiconductor art. Which specific art is utilized in forming these components will be determined, in part, by requiring processing compatability with the other elements in the memory.

The use of the present invention with a very general type of memory cell will first be described. Thereafter, the operation of this invention will be described in detail for the specific memory cells shown in FIG. 6, 7, and 8.

In FIG. 1, the memory cells 1 are of the general type such that to recall the datum stored in any particular memory cell 1, the control electrode 3 of that particular memory cell 1 is appropriately activated. Subsequently thereto, the potential on the output terminal 2 of that particular memory cell 1 indicates the datum stored therein. In practical embodiments, the memory cells 1 are formed in large arrays with like terminals of a large number of memory cells 1 connected in common by means of a relatively extensive conductive means, such as the column conductors 5. As a consequence, the capacitive loading at the output terminal 2 of the memory cell 1 can be relatively large, and when the datum stored in a memory cell 1 is recalled, this capacitive loading diminishes the difference between the output signal from a memory cell 1 containing a 1 (the 1 output signal) and the output signal from a memory cell 1 containing a 0 (the 0 output signal).

With the present invention, the memory cells 1 in each row are subdivided in to contiguous subrows, and an access transistor 7 is provided for each subrow, as shown in FIG. 1. When recalling the datum stored in a memory cell 1 which is in a particular subrow, the access transistors 7 are used to isolate the output terminals 2 of the memory cells 1 in that particular subrow from the output terminals 2 of all the other memory cells 1. In one method of using this invention, called hereinafter the isolation method, all the access transistors 7 except the one connected to the said particular subrow are turned off, so that only the output terminals 2 of those memory cells 1 in the said particular subrows are connected, via the low resistance parth through the "on" access transistor 7, to the row line 4. Thus those memory cells 1 not in the said particular subrow do not load the output of the memory cell 1 of interest. With the isolation method, the gain transistors 12 are not required.

Often the capacitance of the extensive row line 4 is sufficiently large that it can significantly diminish the difference between the 1 and the 0 output signals. In this case, a second method of using this invention, called hereinafter, the isolation and gain method, can be used. With this method, when recalling the datum stored in a memory cell 1 in a particular subrow, the access transistor 7 connected to the said particular subrow is turned "off", thus isolating the output terminals 2 of all the memory cells 1 in the said particular subrow from the row line 4. Then the control terminal 3 of the memory cell 1 of interest is activated, and the signal from the memory cell 1 is used to control the state of the gain transistor 12. The state of the gain transistor 12 is detected by monitoring the row line 4 to which the gain transistor 12 is connected. In this method of using the present invention, the output terminal 2 of a memory cell 1 is capacitively loaded only by the output terminals 2 of those memory cells 1 in that particular subrow, by the relatively short subrow conductors 6, by the control terminal 13 of the gain transistor 12, and by the output terminal 8 of the access transistor 7.

For a memory array of given size, the advantage of dividing each row of memory cells 1 in to subrows rather than decreasing the numbe of memory cells 1 per row and increasing the number of rows in the array, is that the former requires less semiconductor surfaces area per stored bit than does the later. In general, each row line requires a separate sense amplifier, and row line decoder while each column line requires only a column line decoder. Therefore, the net effect of reducing the number of columns, and increasing the number of rows such that the total number of memory cells 1 remains constant, is to increase the area of the support circuitry required per memory cell 1.

The preceding description of the present invention and its operation is indefinite at some points because many of the specifics of the implementation and operation of this invention depend on the type of memory cell used in the memory, the mode of operation of the memory and the exact technology used to implement the memory. Some of the these specifics will be considered in the following.

In many types of memory arrays, data is entered and recalled from a complete column of memory cells 1 simultaneously. Therefore when using this invention with such memories, it is convenient to organize the subrows in each row, the access transistors 7 for each subrow, and the gain transistors 12 for each subrow to facilitate dealing with one column of memory cells 1 simultaneously. This can be accomplished as shown in FIG. 1 by dividing the columns of memory cells 1 in to contiguous groups, and forming the first subrow of each row from the memory cells 1 in the first group of columns, forming the second subrow of each row from the memory cells 1 in the second group of columns, and so forth; by means of a plurality of control conductors 11, connecting in common all the control terminals 10 of the access transistors 7 of the first subrows, connecting in common all the control terminals 10 of the access transistors 7 of the second subrows, and so forth; by means of a plurality of voltage buses 16, connecting in common all the output terminals 15 of the gain transistors 12 of the first subrows, connecting in common all the output terminals 15 of the gain transistors 12 of the second subrows, and so forth.

With the subrows so formed, and the access transistors 7 and the gain transistors 12 so connected, the plurality of control conductors 11 can be interconnected in a variety of ways, and likewise the plurality of voltage buses 16 can be interconnected in a variety of ways. The operation of some types of memory cells requires that during operations other than the recall operation, addressable access to the output terminals 2 of the memory cells 1 is required. It is convenient to use the row lines 4 to provide the addressable access, and therefore means must be provided to control the state of any particular column of access transistors 7. FIG. 2 illustrates how all the control conductors 11 can be connected in common, and, by means of the switch 19, the control terminals 10 of all the access transistors 7 can be established at either of the two potentials provided by the voltage supply 18. With the circuit shown in FIG. 2, all the access transistors 7 are in the same state. Alternatively, as shown in FIG. 3, each control conductor 11 can be provided with a separate switch 20 by means of which the control terminals 10 of any particular column of access transistors 7 can be established at either of the two potentials provided by the voltage supply 18. In comparison to the arrangement shown in FIG. 2, the arrangement shown in FIG. 3 requires more complex circuitry to control the plurality of switches 20. However, the arrangement shown in FIG. 3 reduces the capacitive loading of the voltage supply 18, which permits faster operation, and by maintaining all the access transistors 7, except for those in the column of interest, in the off state, the capacitive load connected to the row lines 4 is reduced. The arrangement shown in FIG. 2 represents one extreme, and the arrangement shown in FIG. 3 represents another extreme. It is also possible to divide the control conductors 11 in to groups and connecte the control conductors 11 in each group in common, and then provide means for establishing either of two potentials on each group of control conductors 11.

If the isolation method of operation is used, the control conductors 11 cannot be connected as shown in FIG. 2. However, if the isolation and gain method is used, the design goals of the complete memory and the characteristics of the particular cell used in the memory must be considered in determining which of the methods described above will be used to control the state of the access transistors 7.

FIGS. 4 and 5 illustrate two methods of connecting the voltage buses 15 to a voltage source 18. For some memories, operated in certain modes, the voltage buses 15 can be permanently connected to the voltage source 18, so that a constant voltage, which may be ground potential, is maintained on the output terminals 15 of the gain transistors 12. However, for other types of memories, and memories operated in other modes it is possible for the gain transistor 12 to be on during operations other than recall, and this may adversely affect operation of the memory. For example, if during some operation, a particular row line 4 must be held at one potential, and the access transistor 7 connected between that particular row line 4 and a subrow line 6 is off, the gain transistor 12 between the subrow line 6 and the row line 4 may be turned on. This tends to drive the row line 4 to the same potential as the output terminal 15 of the said gain transistor 12 and may prevent proper operation of the memory. Therefore, it can be necessary to require means for isolating the output terminals 15 of the gain transistors 12. FIG. 4 shows a circuit in which all the voltage buses 16 of the memory are connected in common, and by means of switch 21, the voltage buses 15 can be isolated or connected to the voltage source 18. In FIG. 5, separate switches 22 are provided for each voltage bus 16. FIG. 4 illustrates one extreme, and FIG. 5 illustrates another extreme, and it is possible to divide the voltage buses 15 in to groups, connect the voltage buses 15 in each group in common, and then provide means for alternately connecting each group to a voltage source 18 or isolating each group. Which of the circuits described above is actually used depends on the particular memory and its mode of operation.

The description of the operation of this invention when it is used with the memory cells 1 shown in FIGS. 6, 7, and 8 is simplified if the gain transistors 12 and the access transistors 7 are specified to be of a particular type. Therefore, in the following, it will be assumed that the gain transistors 12 and the access transistors 7 of FIGS. 6, 7, and 8 are N-channel enhancement mode field effect transistors, and with the substrate at ground potential, the threshold voltage for the said transistors is $V_{th}$.

In FIG. 6 this invention is shown as it can be used with the 1-T memory cell 1. In the 1-T memory cell, the capacitance of the output terminal 2 is independent of the capacitance of the storage capacitor 24. Therefore in principle, any number of memory cells 1 could be connected to a given row line 4, and the size of the storage capacitor 24 adjusted to provide the required output signals. However, technological limitations restrict the total semiconductor surface area that can be economically used to fabricate a memory array. Subject to the above restriction on total semiconductor surface area, it is economically advantageous to maximize the number of cells in the array. This invention can be used to minimize the size of the memory cell 1 by permitting smaller storage capacitors 24 to be used than would otherwise be possible.

The operation of the subrow of memory cells 1 shown in FIG. 6 will be described under the assumptions previously stated, and assuming that the control transistors 23 are of the same type as the gain transistor 12. A voltage $v_b$ is maintained on the bias buses 26, and on the voltage buses 15 at all times. Therefore, each voltage bus 15 can be permanently connected to a nearby bias bus 26. Binary datum is represented in the memory cell 1 by the charge state of the storage capacitor 24. For example, a relatively large potential drop across the storage capacitor 24 can be used to represent a 0 and a relatively small potential drop across the storage capacitor 24 can be used to represent a 1. With this representation, to enter a 1 in a memory cell 1, the access transistor 7 is turned on by applying the potential $V_g$ to the control electrode 10. A voltage source of potential $V_1$, where $V_1$ is no larger than $V_b$, is applied to the row line 4, so that through the "on" access transistor 7, the subrows line 6 is charged to a potential close to $V_1$. The control transistor 23 of the memory cell 1 of interest is then switched on by applying the voltage $V_g$ to its control terminal 3. The storage capacitor 24 then becomes charged so that the potential drop across it is approximately $V_b - V_1$. Up to this point in the enter operation, the sequence of the steps is not critical. The control transistor 23 is then switched "off," by for example grounding the column line 5, and then the potential $V_1$ can be removed from the row line 4. The enter a 0, a similar process is followed, except that a voltage source of potential $V_o$, where $V_o$ is less than $V_b$, is applied to the row line 4, so that on completion of the enter 0 process, the potential drop across the storage capacitor is approximately $V_b - V_o$.

Note that during the operations described above, the control terminal 13 of the gain transistor 12 is always at about the same potential as the input terminal 14, and the potential on the output terminal 15 is not less than the potential on the input terminal 14. Therefore, the gain transistor 12 is in the "off" state during the enter operation.

To retain the data in the memory cells 1, the potential $V_b$ is maintained on the bias buses 26, and the control transistors 23 are maintained in the "off" state.

To recall the datum from a particular memory cell 1, the access transistor 7 is turned on by applying the voltage $V_g$ to the control terminal 10. A potential $V_r$, approximately midway between the potential $V_1$ and the potential $V_o$, is applied to the row line 4. Through the "on" access transistor 7, the subrow line 6 charges up to approximately the potential $V_r$. Then the access transistor 7 is turned off. To achieve maximum sensitivity, the magnitude of the potential on the row line 4 can be decreased after the access transistor 7 is turned off, so that the difference between the potential of the row line 4 and the potential of the subrow line 6 is slightly less than the threshold voltage of the gain transistor 12. In a simplier, but less sensitive mode of operation, the potential on the row line 4 can be left unchanged at $V_r$.

In either case, the control transistor 23 of the memory cell 1 of interest is then turned on, so that the storage capacitor 24 is connected, via the relatively low resistance of the "on" control transistor 23 to the subrow line 6. If there is a large potential drop across the storage capacitor 24, the potential on the subrow line 6 increases, and the gain transistor 12 is turned on. If there is a small potential drop across the storage capacitor 24, the potential on the subrow line 6 decreases, and the gain transistor 12 is kept off. The state of the gain transistor 12 is detected by monitoring the row line 4.

To minimize the number of different voltages that must be supplied to the circuit, the voltage $V_b$ can be used to turn on the access transistor 7, to turn on the control transistor 23, and for $V_1$.

It is apparent from the above discussion that in the second mode of operation, maximum sensitivity is obtained if the gain transistor 12 has a low threshold voltage. The material used for the gate of the gain transistor 12, the orientation and doping of the semiconductor substrate, and the material and thickness of the gate insulating layer should be chosen with minimization of the threshold voltage in mind. The well known technique for controlling the threshold voltage by using back gate bias can also be used to advantage.

In the mode of operation described above, during recall, if the gain transistor 12 is turned on, the potential on the row line 4 increases. With some sense amplifiers, it is desirable to discharge the row line 4 when the gain transistor 12 is turned on. This can be achieved if the output terminal 15 of the gain transistor 12 is grounded during the recall operation. In this case $V_r$ must be less than the threshold voltage of the gain transistor 12, and the output terminal 15 should be isolted except when recalling data.

FIGS. 7 and 8 illustrate how this invention can be used with charge transfer type memory cells. Unlike the 1-T cell shown in FIG. 6, even in principle, an indefinitely large number of charge transfer memory cells cannot be connected to a given row conductor 4 and still maintain a given minimum difference between the 0 and the 1 output signals. With given output signal requirements, this invention permits the number of charge coupled memory cells per array to be increased over what would otherwise be possible.

The description of the operation of the circuits shown in FIGS. 7 and 8 can be simplified if the properties of the memory cells 1 are specified. Therefore, it will be assumed in the following that the memory cells 1 of FIGS. 7 and 8 operate by storing negative carriers in an inversion region formed in the semiconductor generally beneath the electrodes of the memory cell 1, and that a positive potential must be maintained on these electrodes to establish and maintain the said inversion regions.

The operation of the subrow of memory cells 1 together with the circuit of this invention, shown in FIG. 7, is as follows. In the data retention mode, the substrate 30 is maintained at ground potential, and a bias voltage $V_b$ is maintained on the row conductor 4. The access transistor 7 is maintained "on" so that the potential of the subrow conductor 6 and of the first electrode 27 is very nearly equal to $V_b$. The bias voltage $V_b$ is used to form an inversion region in the semiconductor substrate 30, generally beneath the first electrodes 27. In the memory cell 1, binary data is represented by the number of minority carriers stored in the inversion region beneath the first electrode 27. Let a large number of minority carriers so stored represent a 1 and a small number of minority carriers so stored represent a 0. To alter the number of minority carriers in the inversion region beneath the first electrode 27, a potential $V_g$ is applied to the gate 28, so as to form a minority carrier channel connecting the source 31 and the inversion region beneath the first electrode 27. The potential applied to the source 31, relative to the surface potential of the inversion region beneath the first electrode 27 determines whether minority carriers flow from the source 31 to the inversion region beneath the first electrode 27, or flow from the said inversion region to the source 31.

To enter a 1 in a particular memory cell 1, the source 31 is

To enter a 1 in a particular memory cell 1, the source 31 is grounded and the potential $V_g$ is applied to the gate 28 of the memory cell 1 of interest, to form a minority carrier channel between the source 31 and the inversion region beneath the first electrode 27. After a sufficiently large number of minority carriers have accumulated in the inversion region beneath the first electrode 27, the minority carrier channel is extinguished by, for example, grounding the control electrode 3. During the enter operation, the access transistor 7 is maintained in the "on" state and the bias $V_b$ is maintained on the row line 4.

To enter a 0, a similar process is used, but the potential $V_o$, where $V_o$ is larger than the surface potential of the inversion region beneath the first electrode 27, is maintained on the source 31.

During the enter operation, the control terminal 13 and the input terminal 14 of the gain transistor 12 are at the same potential, so the state of the gain transistor 12 depends on the potential of the output terminal 15. To insure that the gain transistor 12 does not adversely affect the enter operations, the gain transistor 12 can be kept off by maintaining a potential greater than $V_b$-$V_{th}$ on the output terminal 15, or the output terminal 15 can be isolated.

To recall the datum stored in a particular memory cell 1, the access transistor 7 is turned off by, for example, grounding the control terminal 10. This isolates the subrow conductor 6 from the row conductor 4, and leaves the subrow conductor 6 at approximately the potential $V_b$. The output terminal 15 of the gain transistor 12 is maintained at a potential greater than $V_b$-$V_{th}$, so that the gain transistor 12 is in the "off" state. The voltage $V_o$ is then applied to the source 31, the potential $V_g$ is applied to the gate 28, and most of any minority carriers stored in the inversion region beneath the first electrode 27 flow from the said inversion region to the source 31.

If a 1 were stored in the memory cell 1 of interest, the extraction of the relatively large number of minority carriers from the inversion region beneath the first electrode 27 causes the potential on the first electrode 27, and hence on the control terminal 13, to increase. This increase in potential is sufficient to turn the gain transistor 12 "on". If a 0 were stored in said memory cell 1, the few minority carriers extracted from the inversion region beneath the first electrode 27 does not cause the potential of the first electrode 27 to increase sufficiently to turn the gain transistor 12 "on."

The state of the gain transistor 12 is detected by monitoring the row conductor 4.

FIG. 8 shows a third type of memory cell 1 which can be used with the present invention. The operation of the memory cell 1 shown in FIG. 8 has been described in a copending patent, application Ser. No. 642,721 and will not be described in detail herein. The type of memory cell 1 shown in FIG. 8 has a differential output, and requires two row conductors 4, 4' per row of memory cells 1. Therefore two subrow conductors 6, 6', two access transistors 7, and two gain transistors 12 are required per subrow of memory cells 1. The circuit of FIG. 8 illustrates the type of variations of the basic circuit of this invention shown in FIG. 1 that may be required when using this invention with various types of memory cells.

In the data retention mode, a bias voltage $V_b$ is maintained on both the A row conductor 4 and the B row conductor 4', and both access transistors 7 are maintained in the on state. Under these conditions, the potential of the A and B electrodes 32, 33 is approximately $V_b$, and an inversion region is formed beneath said electrodes.

To enter a 1 in a particular memory cell 1, the access transistors 7 are turned on and a potential $V_1$ is applied to the A electrodes 32 by applying the voltage $V_1$ to the A row conductor 4. A potential $V_o$, where $V_o$ is less than $V_1$ is maintained on the B electrodes 33 by applying the voltage $V_o$ to the B row conductor 4'. Then a potential $V_g$ is applied to the gate electrode 34, forming a minority carrier channel between the inversion region beneath the gate electrode 34 and connecting the inversion regions beneath the A electrode 32 to the inversion region beneath the B electrode 33. Most of the minority carriers in the memory cell 1 of interest accumulate in the inversion region beneath the A electrode 32. Then the potential $V_g$ is removed from the gate electrode 34, and the potential $V_b$ is applied to the A and B row conductors 4, 4'.

By symmetry a similar process, but in which the potential $V_o$ is applied to the A row conductor 4 and the potential $V_1$ is applied to the B row conductor 4' can be used to enter a 0.

During the enter operation, the control terminal 13 and the input terminal 14 of the gain transistors 12 are at the same potential, so the state of the gain transistors 12 depends on the potential of the output terminals 15. To insure that the gain transistors 12 do not adversely affect the enter operation, the gain transistors 12 can be kept off by maintaining a potential greater than $V_1$-$V_{th}$ on the output terminals 15, or the output terminals 15 can be isolated.

To recall the datum stored in a particular memory cell 1, the access transistors 7 are turned off, leaving the A and B subrow conductors 6, 6' charged to the potential $V_b$, and a voltage greater than $V_b$-$V_{th}$ is applied to the output terminals 15. Then the voltage $V_g$ is applied to the gate electrode 34 of the memory cell 1 of interest. Minority carriers in the memory cell 1 redistribute themselves beneath A and B electrodes 32, 33 of the memory cell 1 of interest, and the resulting change in the potential on the A and B electrodes 32, 33 is used to control the state of the gain transistors 12. If the memory cell 1 contained a 1, the gain transistor 12 connected to the A row conductor 6 is turned on and the gain transistor 12 connected to the B row conductor 6' is kept off. Conversely, if a 0 were stored in the memory cell 1, the gain transistor 12 connected to the A row conductor 6 is kept off, and the gain transistor 12 connected to the B row conductor 6' is turned on.

To increase the sensitivity of the circuit of this invention, the recall operation for the circuits of FIGS. 7 and 8 can be modified. In particular, by decreasing the potential on the row conductor 4 of FIG. 7 or the row conductors 4, 4' of FIG. 8, after the access transistors 7 have been turned off, so that the difference between the potential between the said conductors and the subrow conductors 6, or 6 and 6', is slightly less than the threshold voltage of the gain transistor 12.

The memory cells shown in FIGS. 6, 7, and 8 require periodic refreshing and because the recall operation is destructive, to save the datum recalled, said datum must be re-entered. After reading and understanding the operations described herein, those familier with the semiconductor art will readily understand the operations required for re-entering and refreshing.

The rapidity with which datum can be recalled depends in part, on the magnitude of the signal presented to the input of the sense amplifier and therefore use of this invention also increases the speed of the recall operation.

The prior art technique, previously described herein, of dividing each of the rows of memory cells in two and using a differential sense amplifier with each of its inputs connected to a different side of the divided row of memory cells, can also be used with this invention to minimize the effects of the leakage currents thru the "off" gain transistors 12.

While this invention has been particularly described with reference to the preferred embodiments thereof, and these preferred embodiments have been described with certain assumptions concerning the circuit elements, it will be understood by those skilled in the art, that various changes in form and details of the apparatus and method may be made without departing from the spirit and scope of the invention. For example although the invention has been described in conjunction with field effect and charge coupled circuit elements, it can also be used in conjunction with bipolar transistors. Also the invention can be used to improve the performance of certain other types of memories, such as memories with non-destructive recall, and content addressable memories.

I claim

1. In a random access memory of the class wherein
a plurality of memory cells,
a plurality of row conductors, and
a plurality of column conductors are disposed such that each of the said memory cells and a specific plurality of said row conductors are mutually associated with each other, and such that each of said memory cells and a specific plurality of said column conductors are mutually associated with each other,
such that, any particular one of said memory cells may be uniquely selected by selecting both the said specific plurality of column conductors associated with that particular one of the said memory cells, and the said specific plurality of row conductors associated with that particular one of said memory cells, and furthermore,
such that the datum stored in any particular one of said memory cells may be determined by monitoring the electrical characteristics of the said specific plurality of row conductors associated with that particular one of the said memory cells, and appropriately activating the said specific plurality of column conductors associated with that particular one of the said memory cells.
a circuit to improve the output signal from the said memory cell comprised of,
a plurality of subrow conductors, each of said subrow conductors being associated with one of the said row conductors.
means for electrically connecting said memory cells to said subrow conductors such that for each particular row conductor of the said specific plurality of row conductors associated with any particular one of the said memory cells, the said particular memory cell is electrically connected to one of the said subrow conductors which is associated with said particular row conductor,
a plurality of first transistors, each of said first transistors having a control terminal, an input terminal, and an output terminal,
means for electrically connecting the said control terminal of each of the said first transistors to said subrow conductors such that each of said first transistors is electrically connected to one of said subrow conductors, and each of said subrow conductors is electrically connected to one of the said plurality of first transistors,
means for electrically connecting the said input terminal of each of the said first transistors to the said row conductors such that each particular one of the said first transistors is electrically connected to that particular one of the said row conductors with which the particular said subrow conductor which is connected to the said particular first transistor, is associated,
a plurality of second transistors, each of said second transistors having a control terminal, an input terminal, and an output terminal,
means for electrically connecting the said output terminal of each of said second transistors to the said subrow conductors such that each one of the said subrow conductors is electrically connected to one of the said second transistors,
means for electrically connecting the said input terminal of each of said second transistors to the said row conductors such that each particular one of the said second transistors is electrically connected to that particular one of the said row conductors with which the particular said subrow conductor which is connected to the said particular second transistor, is associated.

2. The circuit of claim 1 wherein all of the said output terminals of the said first transistors are connected in common.

3. The circuit of claim 1 wherein all of the said control terminals of the said second transistors are connected in common.

4. The circuit of claim 1 wherein the said first transistors are organized in to a plurality of first groups such that each of said first transistors appears in one of said first groups, and the said output terminals of the said first transistors within each of the said first groups are electrically connected in common.

5. The circuit of claim 1 wherein the said second transistors are orgainized in to a plurality of second groups such that each of said second transistors appears in one of the said second groups, and the said control terminals of the said second transistors within each of the said second groups are electrically connected in common.

6. In the class of semiconductor memories comprised of
- a plurality of binary memory cells, and
- a plurality of sense amps,
- said memory cells being disposed in rows and columns such that each of said memory cells appears in one of said rows and in one of said columns,
- each of said memory cells having an output terminal,
- said sense amps being electrical circuits with two stable states,
- said memory cells and said sense amps being electrically connected so that each of said rows of memory cells has associated with it one of the said sense amps, such that
  - when recalling the binary datum stored in a particular one of said memory cells which is in a particular one of said rows,
  - if the datum stored in said particular memory cell has the first of its two possible values, that one of the said sense amps which is associated with said particular row of memory cells assumes one of its two stable states, and
  - if the datum stored in said particular memory cell has the second of its two possible values, that one of the said sense amps which is associated with said particular row of memory cells assumes the other of its two stable states;
- a method of improving the signal from said memory cells when datum is being recalled, comprised of
  - in each of said rows of memory cells, partitioning the said memory cells in that said row to form a plurality of subrows, such that a plurality of said memory cells appears in each of said subrows;
  - in each of said subrows, connecting in common the said output terminals of those of the said memory cells which appear in that said subrow;
  - when recalling datum from said memory cells, utilizing a plurality of access transistors to electrically isolate from each other the said commonly connected output terminals of each of the said subrows such that
    - when recalling datum from a second particular one of said memory cells which is both in a second particular one of the said rows and in a particular one of the said subrows, the said output terminal of said second particular memory cell is electrically isolated from the said output terminals of all of the said memory cells which do not appear in said particular subrow.

* * * * *